(12) United States Patent
Seo et al.

(10) Patent No.: US 7,547,632 B2
(45) Date of Patent: Jun. 16, 2009

(54) METHODS OF FORMING METAL LAYERS IN THE FABRICATION OF SEMICONDUCTOR DEVICES

(75) Inventors: Jung-Hun Seo, Gyeonggi-do (KR);
Gil-Heyun Choi, Gyeonggi-do (KR);
Jong-Myeong Lee, Gyeonggi-do (KR);
Hee-Sook Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/675,158

(22) Filed: Feb. 15, 2007

(65) Prior Publication Data
US 2007/0134932 A1 Jun. 14, 2007

Related U.S. Application Data

(62) Division of application No. 10/812,768, filed on Mar. 30, 2004, now abandoned.

(30) Foreign Application Priority Data
Jul. 7, 2003 (KR) ............................. 2003-45786

(51) Int. Cl.
*H01L 21/44* (2006.01)

(52) U.S. Cl. .......................... 438/681; 257/E21.586; 438/685

(58) Field of Classification Search ................ 438/681, 438/685; 257/E21.586
See application file for complete search history.

(56) References Cited

U.S. PATENT DOCUMENTS

| 5,627,105 | A  | * | 5/1997  | Delfino et al. | 438/627 |
|-----------|----|---|---------|----------------|---------|
| 6,017,818 | A  | * | 1/2000  | Lu             | 438/653 |
| 6,399,491 | B2 | * | 6/2002  | Jeon et al.    | 438/680 |
| 6,458,684 | B1 | * | 10/2002 | Guo et al.     | 438/618 |
| 6,660,628 | B1 | * | 12/2003 | Pan et al.     | 438/627 |
| 6,740,585 | B2 | * | 5/2004  | Yoon et al.    | 438/680 |
| 6,800,494 | B1 | * | 10/2004 | Castle et al.  | 438/14  |
| 2002/0187644 | A1 | * | 12/2002 | Baum et al. | 438/700 |

OTHER PUBLICATIONS

Notice to File a Response for Korean patent application No. 10-2003-0045786 mailed on Apr. 26, 2005.

* cited by examiner

*Primary Examiner*—Asok K Sarkar
(74) *Attorney, Agent, or Firm*—Myers Bigel Sibley & Sajovec

(57) ABSTRACT

A metal deposition processing apparatus includes a first processing chamber configured for holding a semiconductor substrate therein. A second processing chamber is configured for holding the semiconductor substrate therein and for forming an upper metal layer thereon. A transfer chamber is connected to the first processing chamber and the second processing chamber. The transfer chamber is configured to transfer the semiconductor substrate between the first processing chamber and the second processing chamber.

19 Claims, 5 Drawing Sheets

METHODS OF FORMING METAL LAYERS IN THE FABRICATION OF SEMICONDUCTOR DEVICES

REFERENCE TO PRIORITY APPLICATIONS

This application is a divisional of U.S. application Ser. No. 10/812,768, filed Mar. 30, 2004, now abandoned which claims priority to Korean Application No. 2003-45786, filed Jul. 7, 2003. The disclosure of U.S. application Ser. No. 10/812,768 is hereby incorporated herein by reference.

CROSS-REFERENCE TO RELATED APPLICATION

This application is related to co-assigned U.S. Pat. No. 6,849,555, filed May 30, 2003, which is a divisional application of co-assigned U.S. Pat. No. 6,586,340, filed Mar. 13, 2002.

FIELD OF THE INVENTION

The present invention relates to apparatuses used in the fabrication of semiconductor devices and, more particularly, to metal deposition apparatuses used in the fabrication of semiconductor devices and methods of forming metal layers.

BACKGROUND OF THE INVENTION

Various types of conductive material layers may be employed in semiconductor devices. The conductive material layers may be formed using known techniques, such as a physical vapor deposition (PVD) technique or a chemical vapor deposition (CVD) technique. The conductive material layers may be patterned to form interconnection lines for connecting discrete devices with each other on a semiconductor substrate. The interconnection lines may be formed of metal layer(s) having low resistivity in order to enhance the transmission speed of the electrical signals. However, the interconnection lines may also include additional conductive material layers called "barrier metal layers," which can reduce junction spiking phenomenon.

The barrier metal layer can be formed in a gap region such as a contact hole or a via hole or in another area having a high aspect ratio. The barrier metal layer may be conformably formed in the gap region. The barrier metal layer can be formed after the formation of transistors or capacitors. Thus, in order to reduce the degradation of the electrical characteristics of the transistors and capacitors, it may be advantageous to form the barrier metal layer at a relatively low temperature. For example, when the barrier metal layer is formed after formation of an aluminum layer, the barrier metal layer may be formed at a lower temperature than the melting point of the aluminum to reduce degradation of the aluminum. It may also be advantageous to form the barrier metal layer at a low temperature with good step coverage.

The barrier metal layer may be formed using the PVD technique, which may also be referred to as a sputtering technique. However, the PVD technique may exhibit poor step coverage. Thus, a barrier metal layer formed by the PVD technique may not adequately conform to a gap region having a high aspect ratio. Therefore, a chemical vapor deposition (CVD) technique has been proposed to form a conformal barrier metal layer. However, the CVD technique may require deposition temperatures that can be high compared to the temperatures used in the PVD technique. A metal organic chemical vapor deposition (MOCVD) technique can also be used in the formation of the barrier metal layer because the MOCVD technique may provide good step coverage at a low processing temperature.

FIG. 1 is a flow chart illustrating operations according to a conventional MOCVD method of forming a metal interconnection layer.

Referring to FIG. 1, a semiconductor substrate can be loaded into a first chamber (step S1). A barrier metal layer can be formed on the semiconductor substrate in the first chamber (step S2). The barrier metal layer can be formed using a metal organic precursor. Thus, the barrier metal layer may contain carbon atoms. In this case, the barrier metal layer may have a plurality of pores therein. The semiconductor substrate having the barrier metal layer may be unloaded from the first chamber (step S3). After the semiconductor substrate has been unloaded from the first chamber, it can be exposed to air containing oxygen when the wafer is stored, for example, in a wafer storage box until it is needed in the next process step (step S4). The oxygen may penetrate into the porous barrier metal layer, which can result in an increase of the electrical resistance of the barrier metal layer.

The semiconductor substrate in the wafer storage box can be loaded into a second chamber (step S5). An upper metal layer may be formed on the barrier metal layer (step S6). The substrate having the upper metal layer formed thereon can be unloaded from the second chamber (step S7).

As discussed above, the conventional MOCVD technique may lead to an increase in the electrical resistance of the barrier metal layer due to oxygen and/or carbon contamination. Thus, various additional preventive processes may be carried out prior to formation of the upper metal layer. For example, a plasma treatment may be performed to remove the carbon, and/or a degassing process may be performed to remove the oxygen. However, the plasma treatment may not effectively remove carbon from the barrier metal layer if, for example, the barrier metal layer is conformably formed in a gap region that has a high aspect ratio. Also, the degassing process may be performed at a high temperature in order to remove the oxygen in the barrier metal layer. Accordingly, degradation to other substrate layers can occur and/or resistivity of the metal layers may be increased, which can adversely effect the reliability of the barrier metal layer.

SUMMARY OF THE INVENTION

Embodiments according to the present invention provide a metal deposition processing apparatus including a first processing chamber configured for holding a semiconductor substrate therein. A second processing chamber is configured for holding the semiconductor substrate therein and for forming an upper metal layer thereon. A transfer chamber is connected to the first processing chamber and the second processing chamber. The transfer chamber is configured to transfer the semiconductor substrate between the first processing chamber and the second processing chamber.

The first processing chamber can be configured for forming a barrier metal layer on the semiconductor substrate, and the second processing chamber can be configured for forming the upper metal layer on at least a portion of the barrier metal layer on the semiconductor substrate. In other embodiments, the first processing chamber can be configured for flushing a barrier metal layer on the semiconductor substrate, and the second processing chamber can be configured for forming the upper metal layer on at least a portion of the barrier metal layer on the semiconductor substrate.

Methods of forming metal layers on a semiconductor substrate according to embodiments of the present invention include forming a barrier metal layer on a semiconductor substrate in a first processing chamber. The semiconductor substrate is transferred from the first processing chamber to a transfer chamber. The semiconductor substrate is transferred from the transfer chamber to a second processing chamber. An upper metal layer is formed on the barrier metal layer in the second processing chamber.

Methods of forming metal layers on a semiconductor substrate according to further embodiments of the present invention include forming a barrier metal layer on a semiconductor substrate using a metal organic chemical vapor deposition technique. The barrier metal layer is flushed in a first processing chamber. The semiconductor substrate is transferred from the first processing chamber to a transfer chamber. The semiconductor substrate is transferred from the transfer chamber to a second processing chamber. An upper metal layer is formed on the barrier metal layer in the second processing chamber.

Embodiments of the present invention provide metal deposition apparatus that may be suitable for in-situ processing of a barrier metal deposition and an upper metal layer deposition process. In some embodiments, the apparatus includes a first processing chamber for forming a barrier metal layer, a second processing chamber for forming an upper metal layer and a transfer chamber connecting the first processing chamber with the second processing chamber.

In some embodiments, the first processing chamber may be a MOCVD chamber. The first processing chamber can include at least one source gas line for supplying a metal organic source. The second processing chamber may be a CVD chamber, an atomic layer deposition (ALD) chamber or a PVD chamber.

In further embodiments, at least one load lock chamber may be additionally attached to the transfer chamber in order to isolate the transfer chamber as well as the first and second processing chambers from the external atmosphere.

Some embodiments of the present invention provide a metal deposition apparatus that is suitable for an in-situ process of flushing a barrier metal layer and forming an upper metal layer. According to embodiments of the invention, the apparatus includes a first processing chamber for a flushing process, a second processing chamber for forming an upper metal layer and a transfer chamber connecting the first processing chamber with the second processing chamber. The flushing process can be applied to a barrier metal layer formed using a MOCVD technique.

In some embodiments, the first processing chamber includes at least one flushing gas line in order to flush a barrier metal layer. The flushing gas line may include at least one gas selected from the group consisting of the gases containing a halogen group element and the gases containing a halogen group element and a transition metal. The flushing gas may include $TiCl_4$ gas.

In yet further embodiments, at least one load lock chamber may be attached to the transfer chamber in order to isolate spaces in the transfer chamber as well as the first and second processing chambers from the external atmosphere.

Further embodiments of the present invention provide methods of forming a barrier metal layer and an upper metal layer using an in-situ process. The methods include forming a barrier metal layer on a semiconductor substrate loaded into a first processing chamber and forming an upper metal layer on the barrier metal layer inside a second processing chamber without vacuum break.

In some embodiments, a flushing process may be applied to the barrier metal layer prior to formation of the upper metal layer. The flushing process and the upper metal deposition process may be sequentially performed without vacuum break.

In further embodiments, the flushing process may be performed using at least one gas selected from the group consisting of the gases containing a halogen group element and the gases containing a halogen group element and a transition metal. The flushing gas can include $TiCl_4$ gas.

DETAILED DESCRIPTION OF EMBODIMENTS OF THE INVENTION

The present invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout the specification.

Figure 1:
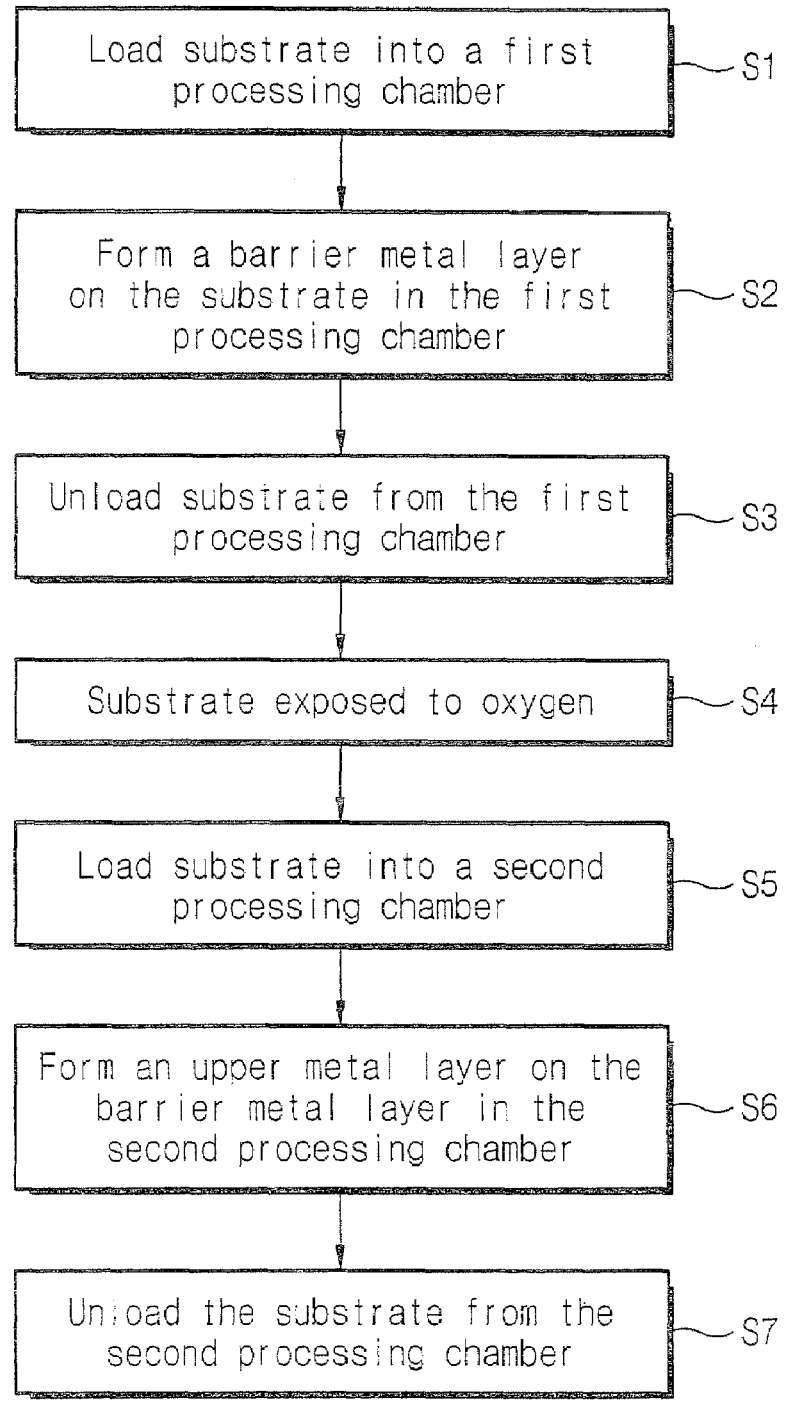
FIG. 1 is a flowchart illustrating operations of a conventional metal deposition process.
Figure 2:
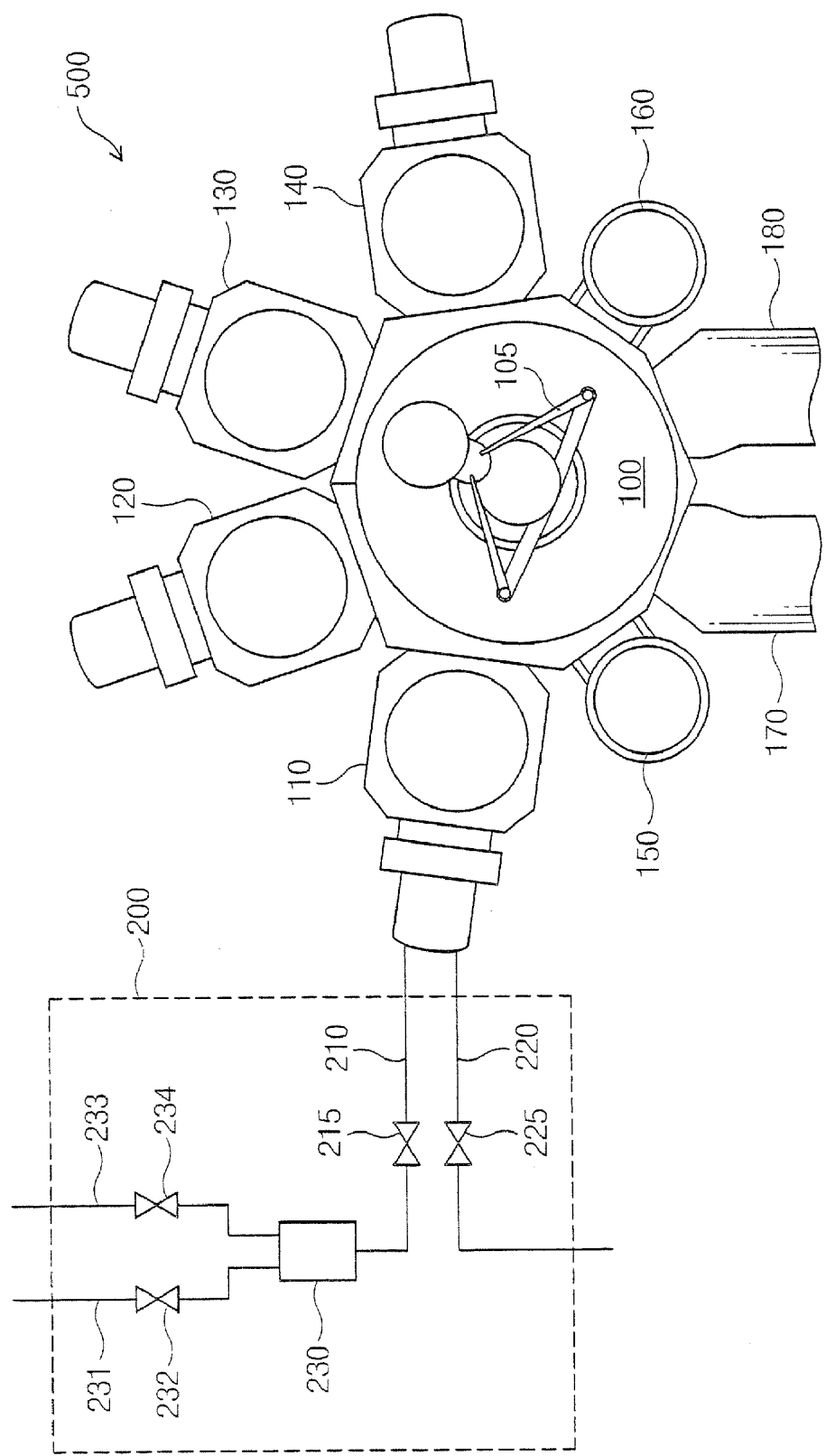
FIG. 2 is a schematic drawing illustrating a metal deposition apparatus according to embodiments of the present invention.

Referring to FIG. 2, a metal deposition apparatus 500 includes a transfer chamber 100 and a plurality of processing chambers 110, 120, 130, and 140 attached to the transfer chamber 100. An alignment chamber 150 and a cooling chamber 160 are also attached to the transfer chamber. A transfer robot 105 is provided in the transfer chamber 100 for transferring substrates from the transfer chamber to/from the processing chambers 110, 120, 130 and 140, the alignment chamber 150 and/or the cooling chamber 160. For example, the transfer robot 105 can be an automated arm configured for holding and transporting a semiconductor substrate.

In the embodiments shown, the plurality of processing chambers may include a first processing chamber 110 and a second processing chamber 120. The first processing chamber 110 can be configured for holding a semiconductor substrate therein to form a barrier metal layer on the substrate using a metal organic chemical vapor deposition (MOCVD) process. The second processing chamber 120 can be configured for holding the substrate therein and for forming an upper metal layer on the barrier metal layer. After the barrier metal layer is formed on the substrate in the first processing chamber 110, the substrate can be unloaded from the first processing chamber 110 and can be loaded into the second processing chamber 120 through the transfer chamber 100, for example, using the transfer robot 105. In this configuration, the substrate in the first processing chamber 110 can be moved into the second processing chamber 120 without a break in the vacuum. Therefore, the barrier metal layer and the upper metal layer can be formed without exposing the substrate to the atmosphere. The second processing chamber 120 may be a chemical vapor deposition (CVD) chamber, an atomic layer deposition (ALD) chamber or a physical vapor deposition (PVD) chamber.

As illustrated in FIG. 2, an auxiliary unit 200 is attached to the first processing chamber 110 for use in the MOCVD process. The auxiliary unit 200 includes at least one source gas supply conduit 210 and an exhaust conduit 220, which are connected to the first processing chamber 110. Also, the auxiliary unit 200 includes a first gas conduit 231 and a second gas conduit 233, which are connected to the source gas supply conduit 210. A source gas may be introduced into the first processing chamber 110 through the first gas conduit 231 and the source gas supply conduit 210, and a carrier gas may be introduced into the first processing chamber 110 through the second gas conduit 233 and the source gas supply conduit 210.

The source gas and the carrier gas can flow through the first and second gas conduits 231 and 233, respectively, and may be mixed in a mixing unit 230. The mixed gas may then flow through the source gas supply conduit 210 to the first processing chamber 110. A supply valve 215 is installed in line with the source gas supply conduit 210 to control the amount of the mixed gas that flows into the first processing chamber 110. A first valve 232 is installed in line with the first gas conduit 231 to control the amount of the source gas that flows through the first gas conduit 231 to the mixing unit 230, and a second valve 234 is installed in line with the second gas conduit 233 to control the amount of the carrier gas that flows through the second gas conduit 233 to the mixing unit 230. As a result, the valves 215, 232 and 234 act as mass flow controllers (MFCs). The valves 215, 232 and 234 can be operated by air pressure or fluid pressure using a controller to control the air pressure or the fluid pressure. The controller may also control the mixing unit 230.

An exhaust valve 225 is installed in line with the exhaust conduit 220. The controller may also control the exhaust valve 225. The auxiliary unit 200 may further include another gas supply conduit that may introduce a hydrogen gas and/or a nitrogen gas into the first processing chamber 110.

The first processing chamber 110 may employ a shower head to improve the flow uniformity of the source gas as well as the deposition characteristic of the barrier metal layer. Also, the first processing chamber 110 may include a heater for increasing the temperature of the first processing chamber and of the semiconductor substrate loaded therein. In addition, the first processing chamber 110 may include electrodes such as a cathode and an anode as well as radio frequency (RF) generators connected to the electrodes. The first processing chamber 110 may include other processing components, including those known to those of skill in the art for performing MOCVD.

In some embodiments, the third processing chamber 130 and/or the fourth processing chamber 140 may be used as an additional processing chamber for forming the barrier metal layer and/or the upper metal layer. Alternatively, the third processing chamber 130 and/or fourth processing chamber 140 may be used as a pre-heating chamber. The pre-heating chamber can heat the semiconductor substrate to a temperature sufficient for the barrier metal deposition process and/or the upper metal deposition process in the first processing chamber 110 or the second processing chamber 120. The alignment chamber 150 can include an optical sensor to align the semiconductor substrate. The cooling chamber 160 can include a circulation conduit for producing a flow path of cooling water and a pump for circulating the cooling water.

Moreover, at least one load lock chamber can be attached to the transfer chamber 100. In some embodiments of the present invention, two load lock chambers (e.g., an input load lock chamber 170 and a output load lock chamber 180) may be attached to the transfer chamber 100 in order to improve the input/output (I/O) efficiency of the semiconductor substrates. For example, load lock chambers 170 and 180 may correspond to an input load lock chamber 170 and an output load lock chamber 180, respectively. A semiconductor substrate can be loaded into the transfer chamber 100 for processing in the metal deposition apparatus 500 through the input load lock chamber 170. After the semiconductor substrate has been processed in the metal deposition apparatus 500, the substrate can be held in the transfer chamber 100 and unloaded through the output load lock chamber 180. Thus, the load lock chambers 170 and 180 are installed between the outside atmosphere and the transfer chamber 100 and can act as buffer chambers. That is, the interior space of the transfer chamber 100 can maintain a high vacuum level even when substrates are loaded and unloaded because of the presence of the load lock chambers 170 and 180. Thus, it may be possible to efficiently lower the pressures in the processing chambers 110, 120, 130, and 140 as well as the transfer chamber 100 during the barrier metal deposition process or the upper metal deposition process. In some embodiments, a single load lock chamber can be provided for loading and unloading a substrate.

A vacuum pump (not shown) can be connected to the transfer chamber 100 to control the pressure in the transfer chamber 100. Gate valves may be installed between the load lock chambers 170, 180 and the transfer chamber 100. Also, other gate valves may be installed between the transfer chamber 100 and the processing chambers 110, 120, 130 and 140. Gate valves may also be installed between the transfer chamber 100 and the alignment chamber 150 and/or the cooling chamber 160.

Figure 3:
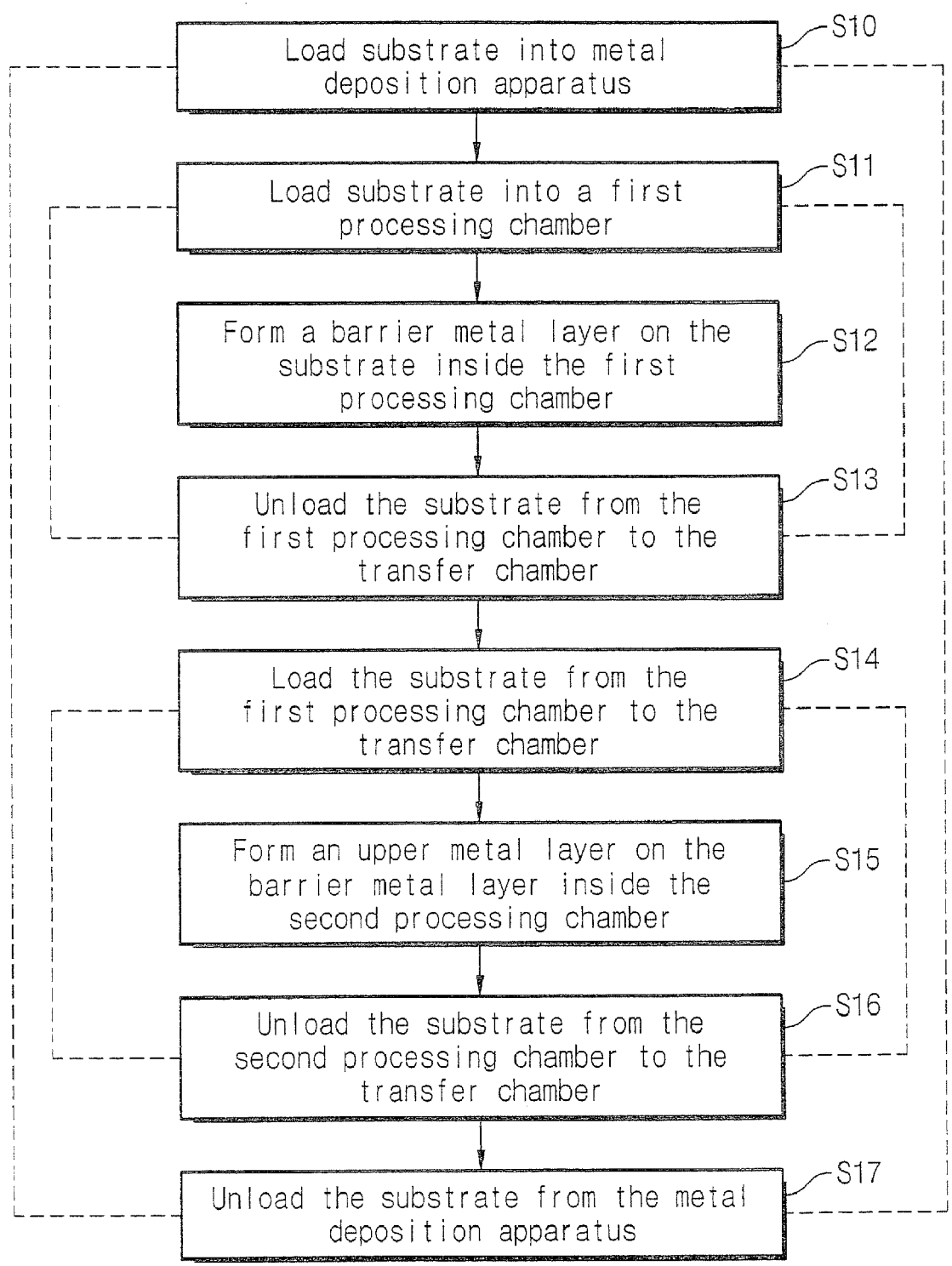
FIG. 3 is a flowchart illustrating methods of forming metal layers according to embodiments of the present invention.

FIG. 3 is flowchart illustrating methods of forming metal layers according to embodiments of the present invention. These methods may be performed using the metal deposition apparatus shown in FIG. 2.

Referring to FIGS. 2 and 3, a semiconductor substrate can be loaded into the metal deposition apparatus 500 (step S10 of FIG. 3). For example, the semiconductor substrate can be loaded into the transfer chamber 100 through the first load lock chamber 170. The semiconductor substrate can be isolated from the outside atmosphere until desired processes are completed in the metal deposition apparatus 500.

The semiconductor substrate in the transfer chamber 100 can be loaded into the first processing chamber 110 (step S11 of FIG. 3). For example, the transfer robot 105 can place the semiconductor substrate in the transfer chamber 100. A barrier metal layer can then be formed on the semiconductor substrate in the first processing chamber 110 (step S12 of FIG. 3). The first processing chamber 110 can be isolated from the transfer chamber 100, for example, by a gate valve. The barrier metal layer may be formed of at least one material layer selected from the group consisting of a titanium nitride (TiN) layer, a titanium silicon nitride (TiSiN) layer and a tantalum nitride (TaN) layer. The barrier metal layer can be formed through a metal organic chemical vapor deposition (MOCVD) technique using a metal organic precursor. In this case, the metal organic precursor may be TDEAT (tetra(diethylamino)titanium) or TDMAT (tetra(dimethylamino)titanium). Further, a plasma treatment may be applied to the barrier metal layer. The semiconductor substrate having the barrier metal layer can then be moved from the first processing chamber 110 into the transfer chamber 100 (step S13 of FIG. 3), for example, by the transfer robot 105.

Subsequently, the semiconductor substrate in the transfer chamber 100 can be moved from the transfer chamber 100 into the second processing chamber 120 (step S14 of FIG. 3). An upper metal layer can be formed on the barrier metal layer inside the second processing chamber 120 (step S15 of FIG. 3), and the second processing chamber 120 can be isolated from the transfer chamber 100, for example, by a gate valve. After the upper metal layer has been deposited, the semiconductor substrate can be unloaded from the second processing chamber 120 and reloaded into the transfer chamber 100 (step S16 of FIG. 3). The upper metal layer may be formed of at least one metal layer selected from the group consisting of a tungsten (W) layer, an aluminum (Al) layer and a copper (Cu) layer. Also, the upper metal layer may be formed using a CVD technique or a PVD technique. The semiconductor substrate can be unloaded from the metal deposition apparatus 500 (step S17 of FIG. 3). That is to say, after depositing the upper metal layer on the semiconductor substrate, the semiconductor substrate can be transmitted from the transfer chamber 100 into the second load lock chamber 180. The semiconductor substrate in the second load lock chamber 180 can be moved into the outside atmosphere.

According to the embodiments described above, the semiconductor substrate can be isolated from the outside atmosphere during various processing steps. That is, the barrier metal layer and the upper metal layer can be successively formed using an in situ process without a break in the vacuum. Thus, even though the barrier metal layer may have a porous structure due to a metal organic source containing carbon atoms, the substrate is moved from one processing chamber to another through a transfer chamber in a vacuum. The vacuum provides a reduced oxygen atmosphere. Accordingly, the substrate may not be exposed to oxygen, therefore, reducing the problems associated with the prior art.

Figure 4:
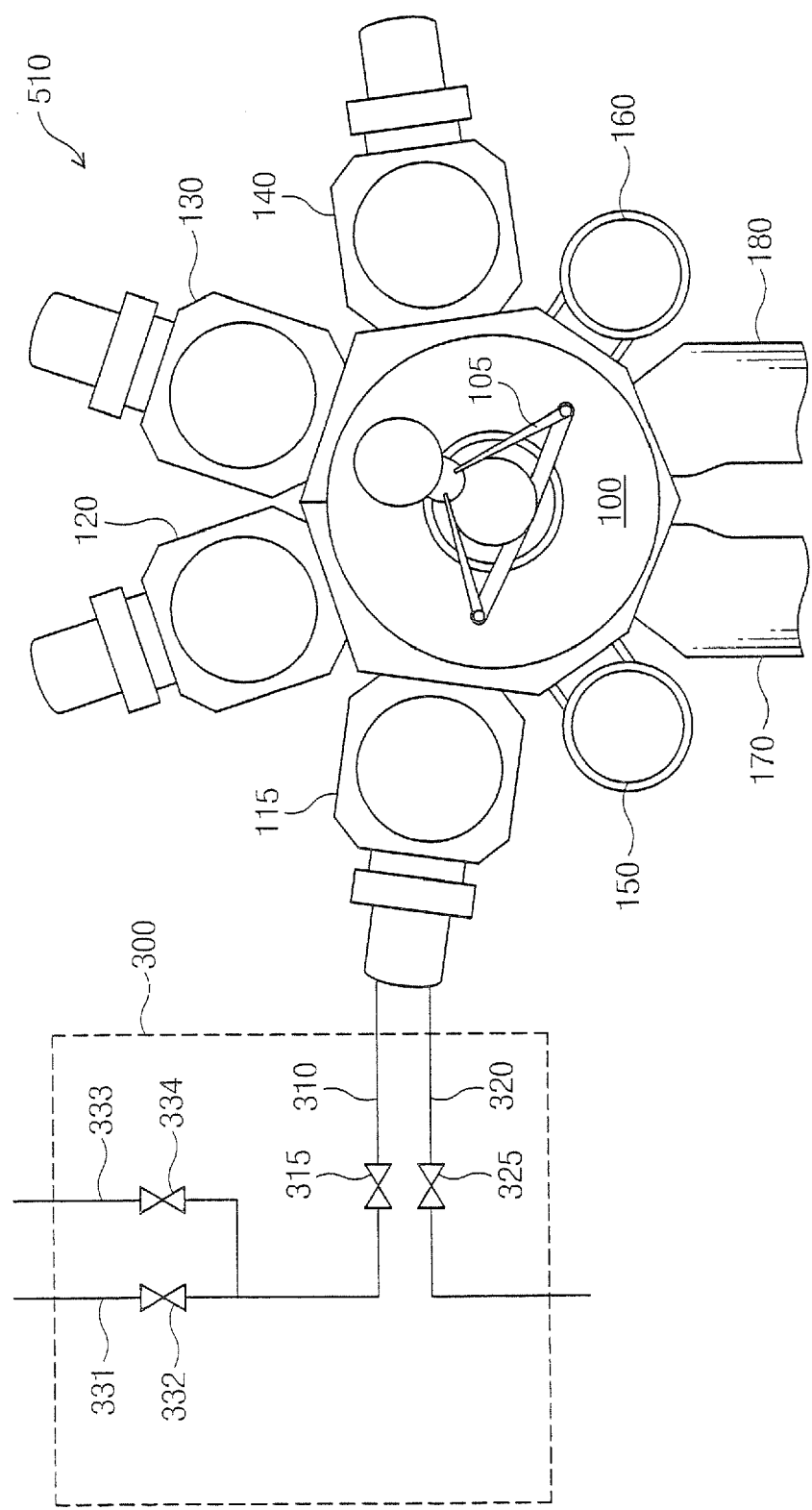
FIG. 4 is a schematic drawing illustrating a metal deposition apparatus according to other embodiments of the present invention.

FIG. 4 is a schematic view illustrating metal deposition apparatus according to other embodiments of the present invention. The metal deposition apparatus 510 according to the embodiments shown provides a flushing chamber 115 instead of the first processing chamber 110 shown in FIG. 2. A flushing process performed inside the flushing chamber can reduce the impurities in a barrier metal layer that has been exposed to air containing oxygen atoms. For ease and convenience of explanation, the same elements as illustrated in FIG. 2 will not be described in detail.

Referring to FIG. 4, the metal deposition apparatus 510 includes a flushing chamber 115 that treats a barrier metal layer for defects. The flushing chamber 115 can be attached to the transfer chamber 100.

An auxiliary unit 300 is connected to the flushing chamber 115 for the flushing process. The auxiliary unit 300 can include at least one flushing gas supply conduit 310 and at least one exhaust conduit 320. The flushing gas supply conduit 310 can be connected to a first gas conduit 331 and a second gas conduit 333. A flushing gas can be introduced into the first gas conduit 331, and a carrier gas can be introduced into the second gas conduit 333. A supply valve 315, a first valve 332 and a second valve 334 can be installed in the flushing gas supply conduit 310, the first gas conduit 331 and the second gas conduit 333. The supply valve 315, the first valve 332 and the second valve 334 can be opened or closed, for example, by air pressure or oil pressure. The air pressure or oil pressure can be controlled by a controller. An exhaust valve 325 can be installed in line with the exhaust conduit 320. The exhaust valve 325 may be also controlled by the controller. The flushing gas may be at least one selected from the group consisting of gases containing a halogen group element and gases containing a halogen group element and a transition metal. The flushing gas may contain a titanium chloride ($TiCl_4$) gas. The carrier gas may be at least one of an inert gas, a hydrogen gas and a nitrogen gas. The inert gas may be a helium (He) gas, a neon (Ne) gas or an argon (Ar) gas.

The flushing chamber 115 may employ a shower head in order to improve the flow uniformity of the flushing gas and the carrier gas as well as the efficiency of the flushing process. Also, the flushing chamber 115 may include a heater for heating the semiconductor substrate loaded into the flushing chamber 115. The flushing chamber 115 may further include a radio frequency (RF) generator and electrodes connected to the RF generator. The flushing chamber may include other processing components, including those known to those of skill in the art.

Figure 5:
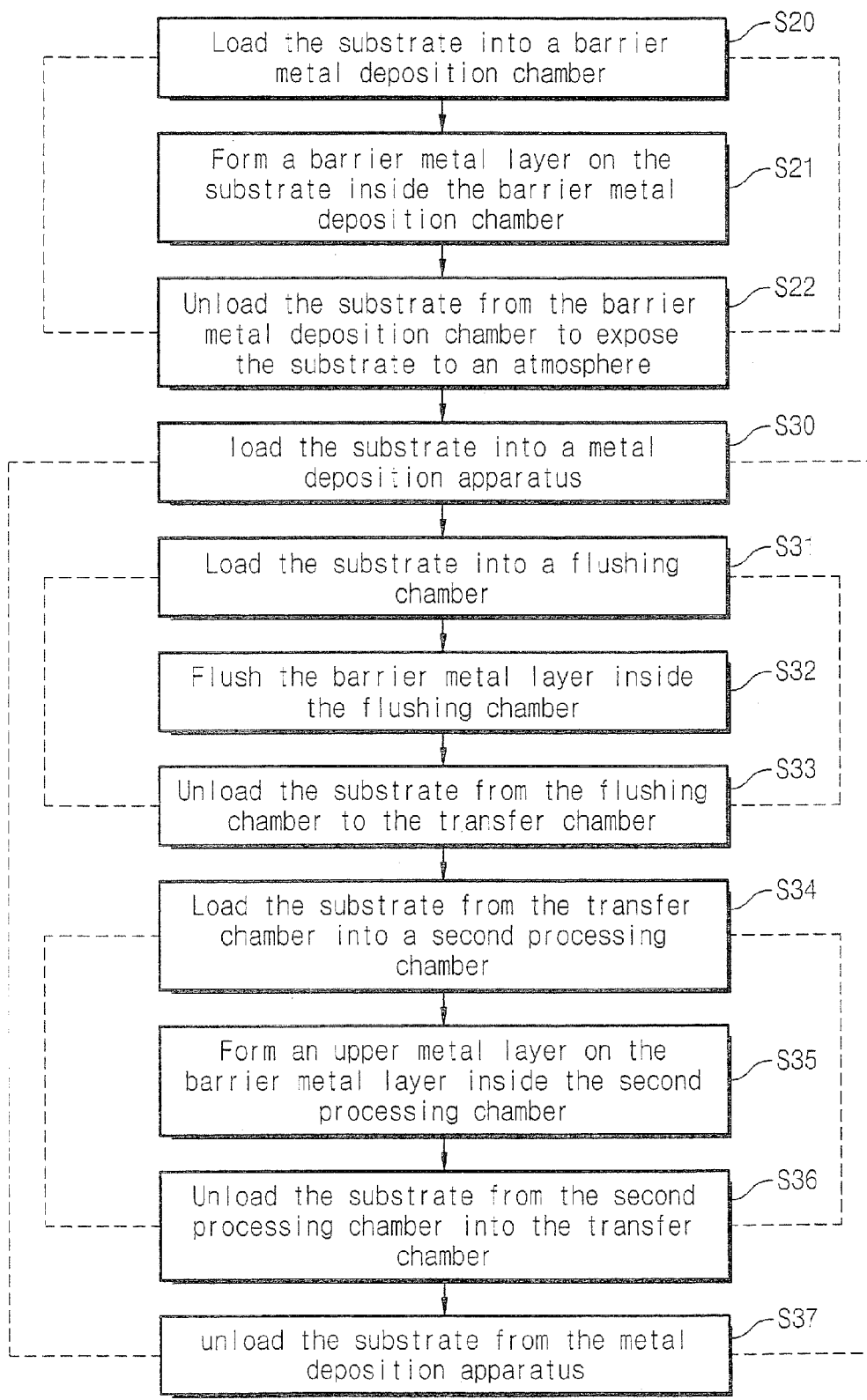
FIG. 5 is a flowchart illustrating methods of forming metal layers according to other embodiments of the present invention.

FIG. 5 is a flowchart illustrating methods of forming metal layers according to embodiments of the present invention. These methods may be performed using the metal deposition apparatus shown in FIG. 4. The same process steps as explained with reference to FIG. 3 will not be described in detail for ease and convenience of explanation.

Referring to FIGS. 4 and 5, a semiconductor substrate can be loaded into a barrier metal deposition chamber (step S20 of FIG. 5). A barrier metal layer can be formed on the semiconductor substrate inside the barrier metal deposition chamber (step S21 of FIG. 5). The barrier metal layer can be formed in a similar manner as described with reference to FIG. 3. However, the barrier metal layer can be formed in a metal deposition chamber in another apparatus prior to being loaded into the metal deposition apparatus 510. The semiconductor substrate having the barrier metal layer may be unloaded from the barrier metal deposition chamber (step S22 of FIG. 5). In this case, the barrier metal layer can be exposed into the air, which can contain an oxygen gas and/or a nitrogen gas.

Subsequently, the semiconductor substrate having the barrier metal layer thereon can be loaded into the metal deposition apparatus 510 shown in FIG. 4 (step S30 of FIG. 5). For example, the semiconductor substrate can be loaded into the transfer chamber 100 through the first load lock chamber 170.

The semiconductor substrate in the transfer chamber 100 can then be loaded into the flushing chamber 115 (step S31 of FIG. 5). A flushing process can be applied to the barrier metal layer inside the flushing chamber 115 (step S32 of FIG. 5). The flushing process may be performed using at least one gas selected from the group consisting of gases containing a halogen group element and gases containing a halogen group element and a transition metal. The flushing gas may be injected with a carrier gas. The carrier gas may be at least one of an inert gas, a hydrogen gas and a nitrogen gas. The inert gas may be a helium (He) gas, a neon (Ne) gas or an argon (Ar) gas. The flushing process can preformed using a titanium chloride ($TiCl_4$) gas as the flushing gas and an Ar gas as the carrier gas. In this case, the $TiCl_4$ gas can be injected to a flow rate of about 1 to 100 sccm (standard cubic centimeter per minute) and the Ar gas can be injected to a flow rate of about 500 to 1000 sccm. Also, the flushing process can be performed at a temperature of about 200 to 500 degrees Celsius and under a pressure of about 1 to 100 torr for about 1 second to 10 minutes. After the barrier metal layer has been flushed, the semiconductor substrate can be transferred from the flushing chamber 115 into the transfer chamber 100 (step S33 of FIG. 5), for example, using the transfer robot 105.

The semiconductor substrate can be loaded from the transfer chamber 100 into the second chamber 120 (step S34 of FIG. 5). An upper metal layer may be formed on the flushed barrier metal layer inside the second chamber 120 (step S35 of FIG. 5). The semiconductor substrate can be transferred from the second chamber 120 into the transfer chamber 100 (step S36 of FIG. 5), for example, using the transfer robot 105. The semiconductor substrate can then be unloaded from the transfer chamber 100 of the metal deposition apparatus 510 through the second load lock chamber 180 (step S37 of FIG. 5).

As a result, the flushing process and the upper metal deposition process can be successively performed using an in-situ process inside the metal deposition apparatus 510.

According to the embodiments of the present invention as described above, the upper metal layer can be formed on a raw barrier metal layer or a flushed barrier metal layer using an in-situ process without a break in vacuum. Embodiments of the present invention can reduce the problems that can be associated with the exposure of the barrier metal layers to air containing oxygen. As a result, the reliability of metal interconnects having a low contact resistance and an improved filling characteristic may be improved.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of forming metal layers on a semiconductor substrate comprising:
   forming a barrier metal layer on a semiconductor substrate in a first processing chamber using a metal organic chemical vapor deposition (MOCVD) method;
   flushing the barrier metal using at least one gas selected from the group consisting of gases containing a halogen group element and gases containing a halogen group element and a transitional metal; and
   forming an upper metal layer on the barrier metal layer in the second processing chamber, wherein the barrier metal layer is isolated from an oxygen atmosphere until the step of forming the upper metal layer to reduce oxygen contamination of the barrier metal layer.

2. The method of claim 1, wherein forming a barrier metal layer includes forming a barrier metal layer of at least one material layer selected from the group consisting of a titanium nitride (TiN) layer, a titanium silicon nitride (TiSiN) layer and a tantalum nitride (TaN) layer.

3. The method of claim 1, wherein forming a barrier metal layer includes using a TDEAT (tetra(diethylamino)titanium) metal organic precursor.

4. The method of claim 1, wherein forming a barrier metal layer includes using a TDMAT (tetra(dimethylamino)titanium) metal organic precursor.

5. The method of claim 1, further comprising isolating the first processing chamber and the second processing chamber from the transfer chamber using a gate valve.

6. The method of claim 1, wherein forming an upper metal layer includes using a chemical vapor deposition (CVD) technique, an atomic layer deposition (ALD) technique, or a physical vapor deposition (PVD) technique.

7. The method of claim 1, further comprising heating the semiconductor substrate in a heating chamber connected to the transfer chamber prior to forming the barrier metal layer.

8. The method of claim 1, further comprising cooling the semiconductor substrate in a cooling chamber connected to the transfer chamber.

9. The method of claim 1, wherein flushing the barrier metal layer further comprises using at least one of inert gases, a hydrogen gas and a nitrogen gas as a carrier gas.

10. The method of claim 1, wherein the flushing further comprises flushing the barrier metal layer using a titanium chloride ($TiCl_4$) gas.

11. The method of claim 1, wherein the barrier metal layer includes a porous structure formed by a metal organic source containing carbon atoms using the MOCVD technique.

12. A method of forming metal layers on a semiconductor substrate comprising:
   forming a barrier metal layer on a semiconductor substrate using a metal organic chemical vapor deposition (MOCVD) technique;
   flushing the barrier metal layer using at least one gas selected from the group consisting of gases containing a halogen group element and gases containing a halogen group element and a transition metal; and
   forming an upper metal layer on the barrier metal layer in the second processing chamber.

13. The method of claim 12, wherein forming a barrier metal layer includes forming a barrier metal layer of at least one material layer selected from the group consisting of a titanium nitride (TiN) layer, a titanium silicon nitride (TiSiN) layer and a tantalum nitride (TaN) layer.

14. The method of claim 12, wherein forming a barrier metal layer includes using a TDEAT (tetra(diethylamino) titanium) metal organic precursor.

15. The method of claim 12, wherein forming a barrier metal layer includes using a TDMAT (tetra(dimethylamino) titanium) metal organic precursor.

16. The method of claim 12, wherein forming an upper metal layer includes using a chemical vapor deposition (CVD) technique, an atomic layer deposition (ALD) technique, or a physical vapor deposition (PVD) technique.

17. The method of claim 12, wherein the flushing of the barrier metal layer further comprises using at least one of inert gases, a hydrogen gas and a nitrogen gas as a carrier gas.

18. The method of claim 12, further comprising flushing the barrier metal layer using a titanium chloride ($TiCl_4$) gas.

19. The method of claim 12, wherein the barrier metal layer includes a porous structure formed by a metal organic source containing carbon using the MOCVD technique.

* * * * *